US 6,191,653 B1

(12) United States Patent
Camp, Jr. et al.

(10) Patent No.: US 6,191,653 B1
(45) Date of Patent: Feb. 20, 2001

(54) CIRCUIT AND METHOD FOR LINEARIZING AMPLITUDE MODULATION IN A POWER AMPLIFIER

(75) Inventors: William O. Camp, Jr., Chapel Hill; Jeffrey Schlang, Raleigh; Charles Gore, Durham; Ronald D. Boesch, Morrisville; Domenico Arpaia, Cary, all of NC (US)

(73) Assignee: Ericsson Inc., Research Triangle Park, NC (US)

( * ) Notice: Under 35 U.S.C. 154(b), the term of this patent shall be extended for 0 days.

(21) Appl. No.: 09/195,384

(22) Filed: Nov. 18, 1998

(51) Int. Cl.[7] .................................................. H03F 3/38
(52) U.S. Cl. .......................... 330/129; 330/10; 330/136; 330/149; 330/297; 455/126
(58) Field of Search .......................... 330/10, 129, 136, 330/149, 297; 455/126; 332/127

(56) References Cited

U.S. PATENT DOCUMENTS

| 4,462,001 | 7/1984 | Girard | 330/149 |
|---|---|---|---|
| 4,597,746 | * 7/1986 | Ericksul | 330/129 |
| 4,985,688 | 1/1991 | Nagata | 332/123 |
| 5,093,637 | 3/1992 | Isota et al. | |
| 5,105,445 | 4/1992 | Karam et al. | 375/60 |
| 5,123,031 | 6/1992 | Kuisma | 375/60 |
| 5,194,822 | * 3/1993 | Bureau et al. | 330/129 |
| 5,204,637 | * 4/1993 | Trinh | 330/129 |
| 5,351,016 | 9/1994 | Dent | 332/60 |
| 5,379,453 | * 1/1995 | Tigwell | 455/151.2 |
| 5,546,326 | * 8/1996 | Van Uffelen et al. | 330/129 |
| 5,598,436 | 1/1997 | Braja et al. | |
| 5,650,758 | 7/1997 | Xu et al. | |
| 6,018,275 | * 1/2000 | Perrett et al. | 332/127 |

FOREIGN PATENT DOCUMENTS

| 196 31 388 | 1/1998 | (DE) . |
|---|---|---|
| 0 360 178A | 3/1990 | (EP) . |
| 0 658 975 | 6/1995 | (EP) . |
| 0 731 556 | 9/1996 | (EP) . |

* cited by examiner

Primary Examiner—Michael B Shingleton
(74) Attorney, Agent, or Firm—Wood, Phillips, VanSanten, Clark & Mortimer

(57) ABSTRACT

An RF amplifier includes an oscillator developing an RF input signal to be transmitted. A power amplifier receives the RF input signal and amplifies the RF input signal to develop an RF output signal. An amplifier control is operatively associated with the oscillator and the power amplifier. The amplifier control includes means for developing a control signal representing a desired amplitude of the RF output signal. A memory stores correction information correlating actual amplitude of the RF output signal relative to the control signal, and a control varies the power amplifier circuit supply voltage using the control signal modified responsive to the correction information for the desired amplitude.

27 Claims, 5 Drawing Sheets

CIRCUIT AND METHOD FOR LINEARIZING AMPLITUDE MODULATION IN A POWER AMPLIFIER

FIELD OF THE INVENTION

This invention relates to RF amplifiers and, more particularly, to a circuit and method for linearizing amplitude modulation in a power amplifier.

BACKGROUND OF THE INVENTION

Radio frequency (RF) transmitters, such as used in cellular telephones, develop an RF signal to be transmitted through the air. Information is carried on the signal via some form of modulation such as frequency modulation, phase modulation, amplitude modulation, or a combination of these.

It may be desirable to create a modulated signal with both amplitude and phase modulation. With the necessity of developing small and lightweight devices, particularly cellular telephones, it is important that such amplifier circuits use a minimum of components. One way to satisfy this desire is to directly modulate an oscillator phase lock loop (PLL) to impart the phase modulation component directly on the signal and then to amplitude modulate the power amplifier stage connected to a voltage controlled oscillator/phase lock loop (VCO/PLL) combination with the amplitude component. VCO/PLL circuits exist that have sufficient bandwidth relative to the information bandwidth of the signal to cause the phase modulation to occur directly on the output signal without any up-conversion. It remains, however, to put an amplitude signal onto this phase modulated signal. This is preferably done in the power amplifier stage, as it will permit this stage to run at high efficiency in a non-linear mode. The amplitude information could be imparted via modulating the power amplifier supply voltage, much as was done with amplitude modulated transmitters previously. However, a difficulty arises in that the transfer function between power amplifier supply voltage and signal amplitude output may not be linear.

Previously, the above problems have been solved by various alternative modulation methods. One is the use of quadrature or I/Q modulation of the RF signal directly. This requires a linear power amplifier. Also, a linear RF power amplifier has used an amplitude feedback loop to make the RF output track the amplitude of the RF input signal. However, a linear power amplifier is not as efficient as a non-linear power amplifier. Also, either a linear or a non-linear power amplifier with an amplitude feedback loop has an inherent limit on the loop filtering that may restrict the amount of noise that can be suppressed from the varying voltage supply.

The present invention is directed to overcoming one or more of the problems discussed above in a novel and simple manner.

SUMMARY OF THE INVENTION

In accordance with the invention there is provided a circuit and method for linearizing the output of an amplitude modulated RF amplifier.

Broadly, there is disclosed herein an RF amplifier including an oscillator developing an RF input signal to be transmitted. A power amplifier circuit receives the RF input signal and amplifies the RF input signal to develop an RF output signal. An amplifier control circuit is operatively associated with the oscillator and the power amplifier circuit. The amplifier control includes means for developing a control signal representing a desired amplitude of the RF output signal. Memory means store correction information correlating actual amplitude of the RF output signal relative to the control signal. Control means vary the power amplifier circuit supply voltage using the control signal modified responsive to the correction information for the desired amplitude.

It is a feature of the invention that the oscillator develops a phase modulated RF input signal.

It is another feature of the invention that the amplifier control circuit comprises a processor circuit.

It is still another feature of the invention that the memory means stores a transfer curve of the power amplifier circuit RF output signal relative to the control signal.

It is still another feature of the invention to provide means coupled to the amplifier control circuit for monitoring the amplitude of RF output signal. The amplifier control circuit periodically updates the correction information using the monitored RF output signal amplitude and the desired amplitude.

It is still another feature of the invention that the control means comprises a switching regulator developing the power amplifier circuit supply voltage. Alternatively, the control means comprises a pulse density generator function such as a delta-sigma modulator and a Class D amplifier stage and a low pass filter developing the power amplifier circuit supply voltage.

It is still a further feature of the invention that the control means comprises a programmed processor controlling the oscillator. The oscillator comprises a high speed phase lock loop (PLL). The PLL includes a voltage-controlled oscillator (VCO) and a divider and a controller for the VCO controls the divider integer. In accordance with another aspect of the invention, another memory means stores a correction table correlating AM to PM conversion to the control signal and the processor sends a pre-distorted phase control signal to the PLL.

In accordance with a further aspect of the invention, the processor controls the VCO.

In accordance with still another aspect of the invention, the oscillator comprises a phase modulated voltage-controlled oscillator.

In accordance with a further aspect of the invention there is disclosed the method of linearizing amplitude modulation in a power amplifier of an amplifier circuit comprising the steps of developing an RF input signal to be transmitted, a power amplifier receiving the RF input signal and amplifying the RF input signal to develop an RF output signal, storing correction information correlating desired amplitude of the RF output signal relative to the power amplifier supply voltage, and varying the power amplifier supply voltage based on variation of the RF input signal to linearize amplitude modulation in the power amplifier.

Further features and advantages of the invention will be readily apparent from the specification and from the drawing.

DETAILED DESCRIPTION OF THE INVENTION

Figure 1:
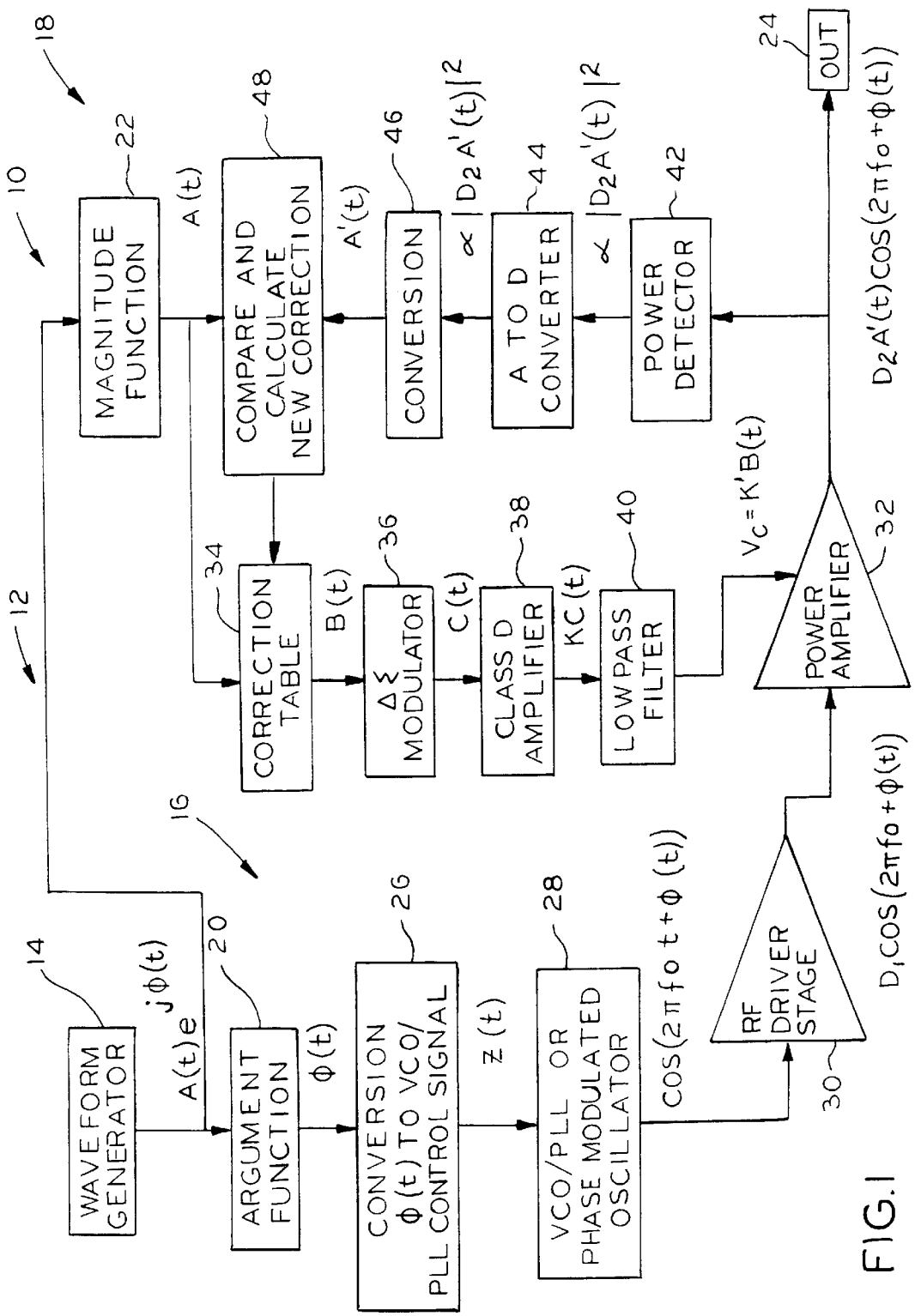
FIG. 1 is a block diagram illustrating an amplifier circuit according to a first embodiment of the invention.

Referring initially to FIG. 1, a transmitter 10 which uses an RF amplifier circuit 12 according to the invention is illustrated. The transmitter 10 may be a device that transmits an RF signal through the air such as in a mobile cellular telephone or the like. More generally, the transmitter 10 may be utilized in any device which creates a modulated signal with both amplitude and phase modulation. The invention is particularly directed to a circuit and method to learn a transfer curve of a power amplifier RF signal amplitude output versus supply voltage to linearize amplitude modulation, as described more particularly below.

In the illustrated embodiment of the invention, the transmitter 10 utilizes a digital signal processor (DSP) and related circuitry for developing the output signal to be transmitted. As will be apparent, the circuit functions could be implemented in an ASIC, a programmed DSP, or a programmed microprocessor, or other similar type device.

The transmitter 10 includes a waveform generator 14. The waveform generator 14 creates the total modulation, including amplitude and phase, appropriate to the digital data being transmitted and the modulation characteristics. The RF amplifier circuit 12 receives the waveform and delivers it to a phase modulation path 16 and an amplitude modulation path 18. The phase modulation path 16 includes an argument function 20 to create a phase modulation signal $\phi(t)$. The amplitude modulation path 18 includes a magnitude function 22 to create an amplitude modulation control signal A(t) representing a desired amplitude of the RF output signal. Various implementations and methods could be used to create these signals. Both signals must be time synchronized such that the net effect through the amplifier circuit 12 is to create the desired composite signal at the output of the power amplifier represented at a block 24.

In the phase modulation path 16, the phase modulation signal is applied to a conversion block 26. The conversion block 26 converts the phase modulation signal to an appropriate format and level necessary for a phase modulated oscillator 28. The oscillator 28 can be any form of phase modulated source. One example is a voltage controlled oscillator (VCO) in a phase-locked loop (PLL), whereby either the reference signal is phase modulated with a complex vector (I/Q) modulator or the phase modulation is impressed within the loop, as discussed below. The phase modulation is now part of an RF signal at frequency $f_0$ and is amplified by an RF driver stage 30. The RF driver stage 30 supplies sufficient signal level to a power amplifier 32 so that it is overdriven and the output of the power amplifier 32, representing the output 24, only responds to the level of its supply voltage.

In the amplitude modulation path 22, the control signal from the magnitude function 26 is applied to a correction table 34. The correction table 34 is stored in a suitable memory of the amplifier circuit associated with the DSP. The memory stores an inverse of the transfer curve of the power amplifier RF signal amplitude output versus the control signal. Particularly, the correction table 34 modifies the value of the desired amplitude to an amplitude that, when applied to the system, results in the correct amplitude of the RF signal out. The modified control signal is applied to a modulator 36 that creates a sequence of one bit digital signals whose average mimics the input waveform. Any pulse density modulator could be used. However, a delta-sigma modulator has the advantage that its noise versus frequency is low at low frequencies and high at high frequencies. A Class D amplifier stage 38 boosts the current capacity of the modulated signal as its output is either the full battery voltage or zero, depending on the binary state of the signal input to the modulator 36. The amplified signal is applied through a low pass filter 40 with the smooth voltage being connected to the drain or collector of the power amplifier 32. Thus, when empowered by the power amplifier 32 on the RF signal from the phase-modulated source, the final output signal is the original waveform created by the waveform generator 14 but now on an RF carrier signal at frequency $f_0$.

To maintain a faithful reproduction of the signal from the waveform generator 14 to the output 24, it is necessary to continually correct for non-linearities in the amplitude modulation process. The power level at the output of the power amplifier 32 is measured with a power detector circuit 42. The power signal is sampled at an analog-to-digital converter 44. A conversion block 46 converts the power level to amplitude by taking the square root and scaling it to the appropriate level with a constant so that it can be compared with the desired amplitude at a block 48. Particularly, the block 48 compares the desired amplitude from the block 22 and the measured amplitude from the block 46 and a new correction value is calculated for the particular level of the desired amplitude. The new value is inserted in the correction table at the block 34 if it is sufficiently different from the prior stored value for that specific value of the control signal A(t).

The correction table at the block 34 is maintained over varying conditions of temperature, power amplifier loading, battery voltage, etc. The maintenance of the correction table in the block 34 is easily done at a very low sampling rate.

Figure 2:
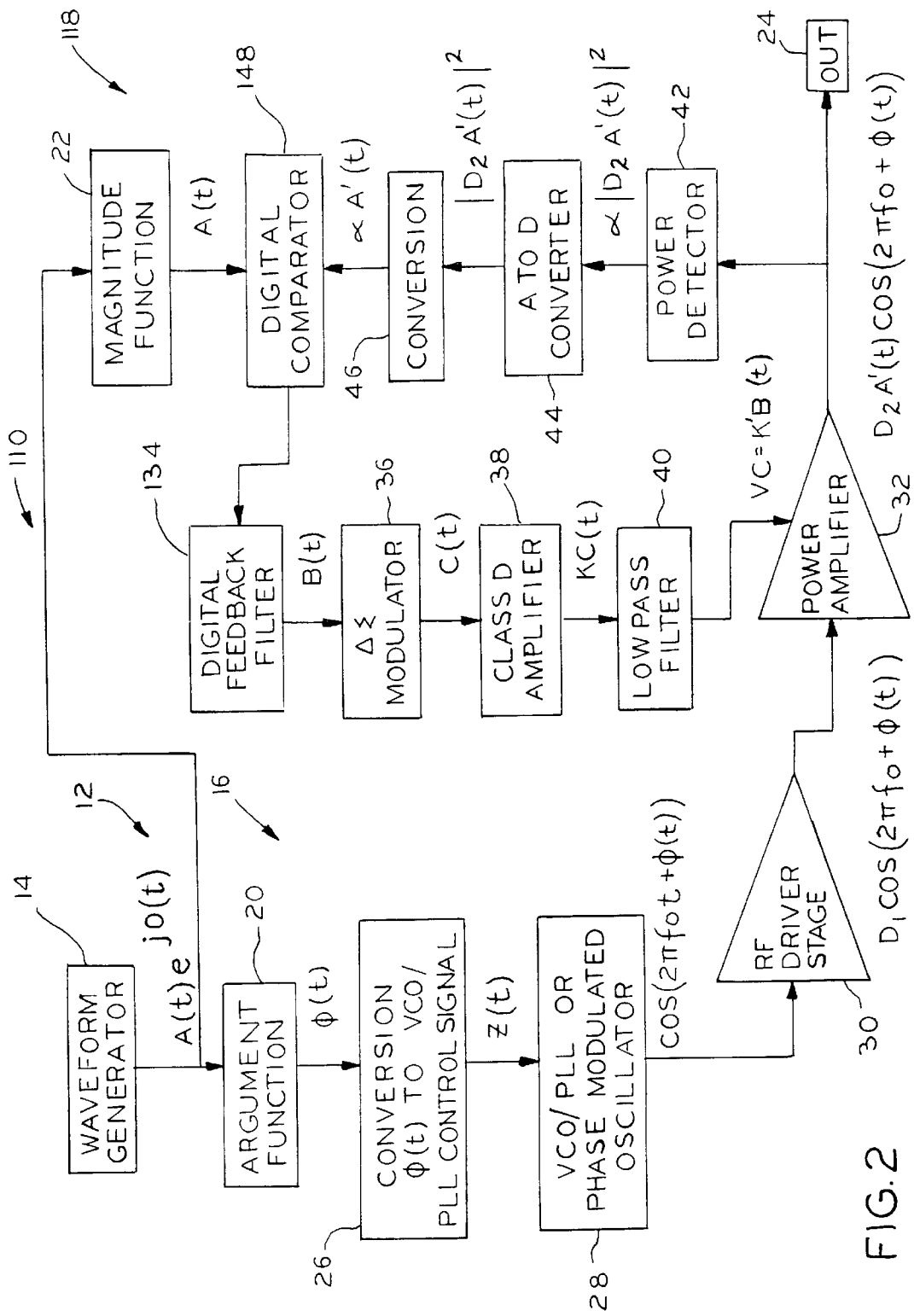
FIG. 2 is a block diagram illustrating an amplifier circuit according to a second embodiment of the invention.

Optionally, the hardware sampling process can be run at a sufficiently high rate that a real-time digital feedback loop is incorporated using the same hardware and slightly different digital processing. Referring to FIG. 2, a transmitter 110 according to a second embodiment of the invention is illustrated. The transmitter 110 includes an amplifier circuit 112. Many of the elements of the transmitter 110 correspond directly to related elements in the transmitter 10 of FIG. 1. For simplicity, these elements utilize like reference numerals. Where the elements are generally similar, they are referenced with reference numerals one hundred higher.

In the second embodiment the amplitude modulation path 118 differs in that the comparison block 48 is replaced with a digital comparator 148 and the correction table 34 with a digital feedback filter 134. The desired amplitude signal of the magnitude function 22 and the measured amplitude signal from the conversion block 46 are input to the digital comparator 148 appropriate to a digital feedback loop. The output of the digital comparator 148 goes to the digital feedback filter 138. The digital feedback filter 134 has a cutoff frequency sufficiently large to pass the frequency components of the desired amplitude modulation signal. Since the low pass filter 40 will want the lowest possible cutoff frequency to remove noise from the modulator 36, the digital feedback filter 134 will have a cutoff frequency higher than that of the low pass filter 40.

Figure 3:
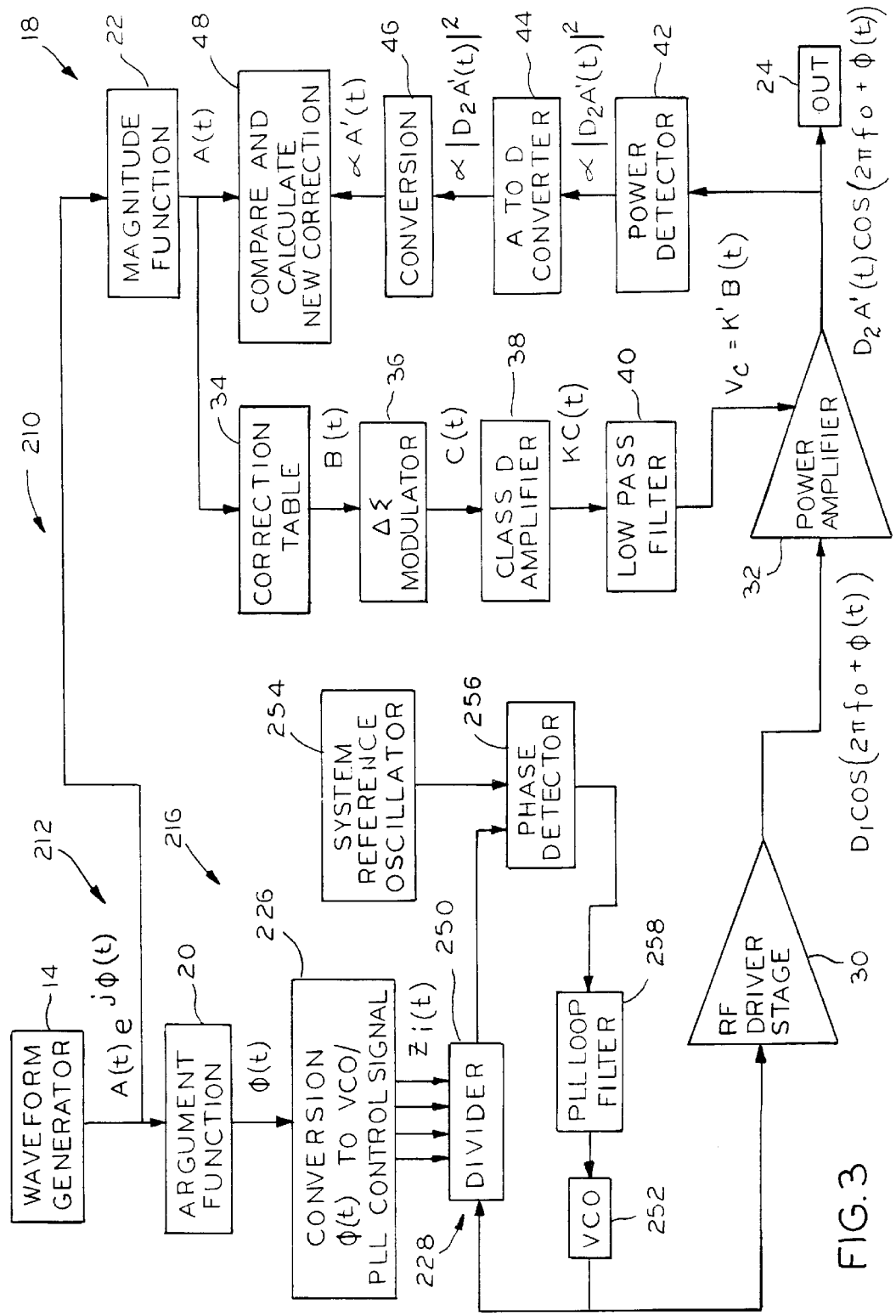
FIG. 3 is a block diagram illustrating an amplifier circuit according to a third embodiment of the invention.

Referring to FIG. 3, a transmitter 210 according to a third embodiment of the invention is illustrated. The transmitter 210 includes an amplifier circuit 212. Many of the elements of the transmitter 210 correspond directly to related elements in the transmitter 10 of FIG. 1. For simplicity, these elements utilize like reference numerals. Where the elements are generally similar, they are referenced with reference numerals two hundred higher.

The amplifier circuit 212 differs from the amplifier circuit 12 by utilizing a different phase modulation path 216. The desired phase modulation signal from the argument function block 20 is input to a conversion block 226 which converts the phase modulation signal into a set of binary control signals $Z_{i(t)}$ to control the divisor number of a frequency divider 250. As a result, the divisor number of the divider 250 is changing at a rate equal to the system clock and creates an averaged divisor ratio that sets the character frequency of a VCO 252 and forces it to track the desired phase modulation signal. A system reference oscillator 254, phase detector 256, and PLL filter 258, along with the oscillator 252 and divider 250, make up a phase lock loop source 228 that is now being phase modulated. The output of the VCO 252 is applied to the RF driver stage 30.

The advantage of using the PLL configuration of FIG. 3 is that the loop bandwidth is significantly higher and encompasses that necessary to pass the phase modulation frequency components.

Figure 4:
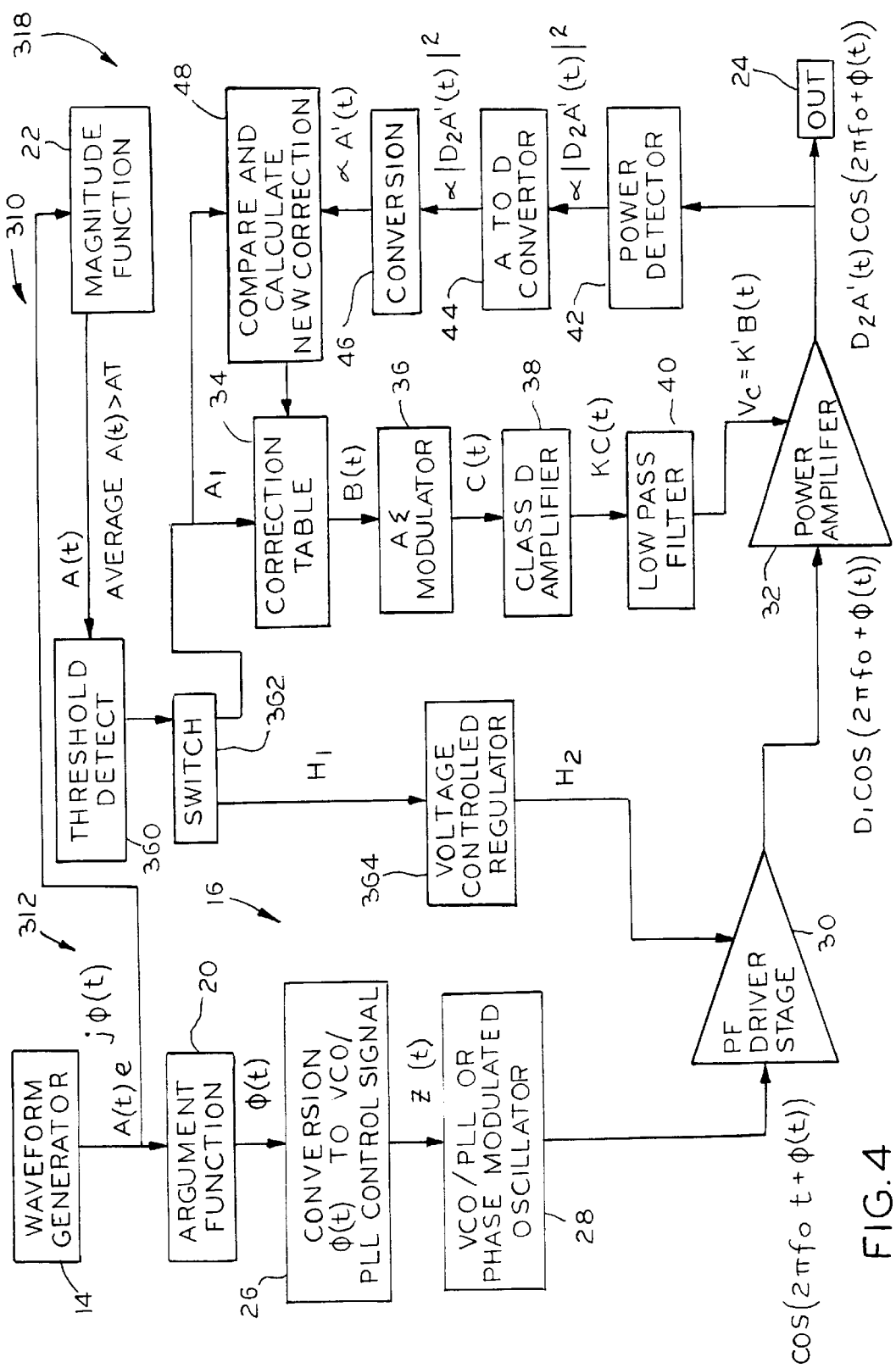
FIG. 4 is a block diagram illustrating an amplifier circuit according to a fourth embodiment of the invention.

Referring to FIG. 4, a transmitter 310 according to a fourth embodiment of the invention is illustrated. The transmitter 310 includes an amplifier circuit 312. Many of the elements of the transmitter 310 correspond directly to related elements in the transmitter 10 of FIG. 1. For simplicity, these elements utilize like reference numerals. Where the elements are generally similar, they are referenced with reference numerals three hundred higher.

The amplifier circuit 312 differs from the amplifier circuit 12 of FIG. 1 in providing a range of amplitude modulation that is larger than can be supported by just varying supply voltage to the power amplifier 32 alone.

The desired amplitude signal A(t) from the magnitude function block 22 is applied to a threshold detector 360. The threshold detector 360 determines whether the average of the control signal is greater than or less than a preselect value $A_T$. The threshold detector 360 controls operation of a switch 362. The switch 362 determines a level A1 used for controlling the power amplifier 32 and a value H1 for controlling the RF driver stage 30. The value H1 is applied to a voltage controlled regulator 364 to supply the RF driver stage 30. The value A1 is used subsequently as the desired amplitude control signal in the amplitude modulation path 318.

The threshold detector 360 and switch 362 are programmed to implement the following logic. For desired amplitudes where the average of A(t) is greater than $A_T$ the switch 362 routes the signal A(t) to A1 and sets H1 to a DC level, dependent on the average of A(t), such that the signal from the driver stage 30 is just sufficient to drive the power amplifier 32 into saturation at the maximum output power it will be required to deliver. For amplitudes where the average of A(t) is less than $A_T$, the switch 362 routes A(t) to H1 using an appropriate scale factor. The value A1 is set to a DC level, dependent on the average of A(t), such that the power amplifier 32 is sufficiently biased to be a linear amplifier for the amplitude modulated signal from the driver stage 30.

Thus, when the average of A(t) is above the threshold, then the modulation goes to the power amplifier 32 as described above relative to FIG. 1. At the same time, the threshold information is also used to determine the maximum output level from the power amplifier 32 and to set the supply to the driver stage 30 using the voltage controlled regulator 364 such that the power out of the driver 30 is just sufficient to over-drive the power amplifier and not more. As a result, the drive level is reduced as a maximum power out of the power amplifier 32, determined by the peak of A(t), is reduced. This happens as the average power level to be delivered from the transmitter 10 is reduced independent of the normal modulation excursions in A(t). With lower drive level, when the average power output is reduced, the modulation range of the output power amplifier 32 is increased. This happens because the lower limit on modulation of the power amplifier is set by incidental feed-through of RF signal at the low amplifier supply voltage. With lower drive at these conditions, the modulation will work to a lower level of drain or collector voltage. Only a few discrete drive levels need be established for this.

When the average of A(t) is below the threshold, then the modulation signal is now routed to the regulator 364 for supply to the drive stage 30 where the modulation now occurs. The control to the power amplifier 32 is now set at an appropriate DC level to allow the power amplifier 32 to act as a linear amplifier. It is set at a minimum, consistent with the average level of output, to reduce power dissipation in the power amplifier 32. As the average power of A(t) continues down through lower output classes, the DC level to the power amplifier is also dropped to keep power dissipation to a minimum for all average output levels.

Figure 5:
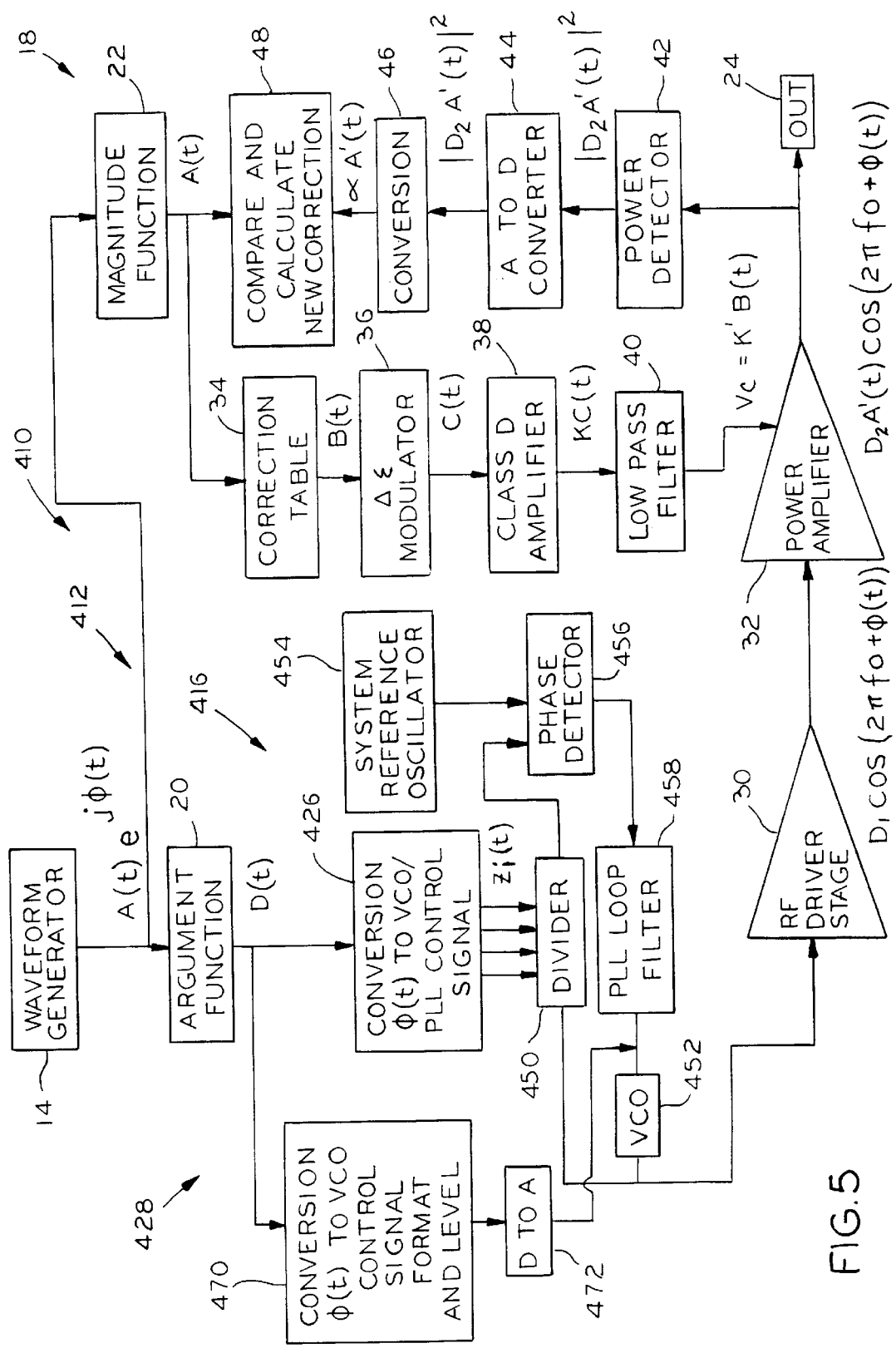
FIG. 5 is a block diagram illustrating an amplifier circuit according to a fifth embodiment of the invention.

Referring to FIG. 5, a transmitter 410 according to a fifth embodiment of the invention is illustrated. The transmitter 410 includes an amplifier circuit 412. Many of the elements of the transmitter 410 correspond directly to related elements in the transmitter 10 of FIG. 1. For simplicity, these elements utilize like reference numerals. Where the elements are generally similar, they are referenced with reference numerals four hundred higher.

The amplifier circuit 412 includes a phase modulation path 416 modified from the phase modulation path 216 of FIG. 3 to use a two point method of phase modulating the VCO/PLL to extend spectrum capability. An oscillator 428 includes conversion blocks 426 and 470 that receive the desired phase modulation signal. The conversion block 470 scales and formats the phase modulation signal for use in a second modulation path. The first path is that discussed above relative to FIG. 3. The phase modulation due to the first path only appears on the RF signal with spectral components out to the loop bandwidth of the PLL. The second path supplies the same phase modulation, now scaled and formatted by the conversion block 470 into a D/A converter 472 which is input to the VCO 452. As a result, the phase modulation signal is now imparted directly into the VCO tuning port. This permits phase modulation spectrum components in excess of the loop bandwidth to be impressed onto the RF signal.

It is important that the level and phase of the second path match the level and phase of the first path so that the frequency response of the composite paths is flat. The levels and phasing with respect to each other can be readily controlled by the functions implemented in the blocks 14, 20, 426, and 470. The VCO tuning gain in MHz per volt will likely vary over frequency tuning range and temperature and manufacture. It is necessary to have a method to measure this parameter periodically. This is done by the amplifier circuit 412 being programmed to command the channel through the blocks 470 and 472 to go to zero volts. The phase detector 456 is often the kind that is digital with charge pumps. This enables the phase detector 456 to also be a frequency detector function for purposes of the calibration.

It may be advantageous to modify the phase detector 456 to more readily extract frequency measurement information, as this is normally not one of its functions in the usual VCO/PLL configurations. The charge pump in the phase detector is then turned off to the loop filter 458. The frequency is the measured with the phase detector 456. The voltage from the D/A block 472 is then stepped to a known value. The frequency into the phase detector 456 is then measured. The VCO tuning sensitivity is then computed in MHz per volt. The appropriate scaling factor is then computed for the conversion block 470. Finally, the charge pumps are again turned on in the phase detector 456.

As is apparent, the transmitter 10 of FIG. 1 illustrates a basic transmitter design with separate phase modulation and amplitude modulation using the method for linearization of the amplitude modulation in accordance with the invention. FIGS. 2–5 illustrate alternative transmitter designs using the same basic method for linearization at the amplitude modulation in a transmitter having separate phase modulation.

As will be appreciated by one of ordinary skill in the art, the present invention may be embodied as methods or devices. Accordingly, the present invention may take the form of an entirely hardware embodiment, an entirely software embodiment, or an embodiment combining hardware and software aspects. The present invention has been described with respect to the block diagram illustrations of FIGS. 1–5. It will be understood that many of the blocks can be implemented by computer program instructions. These program instructions, which represent steps, may be provided to a processor to produce a machine.

Accordingly, blocks of the illustration support combinations of means for performing the specified functions in combinations of steps for performing the specified functions. It will be understood that each block of the illustrations, and combinations of blocks in the illustrations, can be implemented by special purpose hardware-based systems which perform the specified functions or steps, or combinations of special purpose hardware and computer instructions.

Thus, in accordance with the invention there is provided an amplifier circuit in which distortion in the supply voltage to RF output transfer function of the power amplifier is corrected. This therefore also provides correction in the modulation input to RF output transfer function.

We claim:

1. An RF amplifier comprising:
   an oscillator developing an RF input signal to be transmitted;
   a power amplifier receiving the RF input signal and amplifying the RF input signal to develop an RF output signal;
   an amplifier control operatively associated with the oscillator and the power amplifier, the amplifier control including means for developing a control signal representing a desired amplitude of the RF output signal, memory means for storing correction information correlating actual amplitude of the RF output signal relative to the control signal and control means for varying the power amplifier circuit supply voltage using the control signal modified responsive to the correction information for the desired amplitude.

2. The RF amplifier circuit of claim 1 wherein the oscillator develops a phase modulated RF input signal.

3. The RF amplifier circuit of claim 1 wherein the amplifier control comprises a processor.

4. The RF amplifier circuit of claim 1 wherein the memory means stores an inverse of a transfer curve of the power amplifier RF output signal relative to the control signal.

5. The RF amplifier circuit of claim 1 further comprising means coupled to the amplifier control for monitoring amplitude of the RF output signal.

6. The RF amplifier circuit of claim 5 wherein the amplifier control periodically updates the correction information using the monitored RF output signal amplitude and the desired amplitude.

7. The RF amplifier circuit of claim 1 wherein the control means comprises a switching regulator developing the power amplifier circuit supply voltage.

8. The RF amplifier circuit of claim 1 wherein the control means comprises a class D amplifier stage developing the power amplifier supply voltage.

9. The RF amplifier circuit of claim 1 wherein the control means comprises a programmed processor controlling the oscillator.

10. The RF amplifier circuit of claim 9 wherein the oscillator comprises a high speed phase locked loop (PLL).

11. The RF amplifier circuit of claim 10 wherein the PLL includes a voltage-controlled oscillator (VCO) and a divider in a control loop for the VCO controls the divider integer.

12. The RF amplifier circuit of claim 11 wherein the memory means stores a correction table correlating AM to PM conversion to the control signal and the processor sends a predistorted phase control signal to the PLL.

13. The RF amplifier circuit of claim 11 wherein the processor controls the VCO.

14. The RF amplifier circuit of claim 9 wherein the oscillator comprises a phase modulated voltage-controlled oscillator.

15. The method of linearizing amplitude modulation in a power amplifier of an amplifier comprising the steps of:
    developing an RF input signal to be transmitted;
    a power amplifier receiving the RF input signal and amplifying the RF input signal to develop an RF output signal;
    storing correction information correlating amplitude of the RF output signal relative to a power amplifier supply voltage control signal; and
    varying the power amplifier supply voltage using the control signal modified by the correction information to linearize amplitude modulation in the power amplifier.

16. The method of claim 15 wherein the developing step comprises developing a phase modulated RF input signal.

17. The method of claim 15 wherein the storing step comprises storing an inverse of a transfer curve of the power amplifier RF output signal relative to the control signal.

18. The method of claim 15 further comprising the step of monitoring amplitude of the RF output signal.

19. The method of claim 18 further comprising the step of periodically updating the correction information using the monitored RF output signal amplitude and the control signal.

20. The method of claim 15 wherein the varying step comprises developing a control signal to a switching regulator developing the power amplifier circuit supply voltage.

21. The method of claim 15 wherein the varying step comprises developing a control signal to a class D amplifier stage developing the power amplifier circuit supply voltage.

22. The method of claim 16 wherein the developing step comprises operating a programmed processor to control an oscillator.

23. The method of claim 22 wherein the oscillator comprises a high speed phase locked loop (PLL).

24. The method of claim 23 wherein the PLL includes a voltage-controlled oscillator (VCO) and a divider in a control loop for the VCO and the operating step comprises controlling the divider integer.

25. The method of claim 24 further comprising coupling the power amplifier output to the divider to compensate for phase distortion.

26. The method of claim 24 wherein the storing step comprises storing a correction table correlating AM to PM conversion to the power amplifier supply voltage control signal and the processor sends a predistorted phase control signal to the PLL.

27. The method of claim 24 further comprising the step of operating the processor to control the VCO.

* * * * *